US012353138B2

(12) United States Patent
Lee

(10) Patent No.: US 12,353,138 B2
(45) Date of Patent: Jul. 8, 2025

(54) HIGH-SPEED NANOPATTERNING METHOD AND APPARATUS OF TWO-COLOR SUPER-RESOLUTION PHOTOLITHOGRAPHY

(71) Applicant: FOUNDATION OF SOONGSIL UNIVERSITY-INDUSTRY COOPERATION, Seoul (KR)

(72) Inventor: Dong-Ryoung Lee, Seoul (KR)

(73) Assignee: FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 183 days.

(21) Appl. No.: 18/358,735

(22) Filed: Jul. 25, 2023

(65) Prior Publication Data

US 2024/0061343 A1 Feb. 22, 2024

(30) Foreign Application Priority Data

Aug. 16, 2022 (KR) .................. 10-2022-0101939

(51) Int. Cl.
*G03F 7/20* (2006.01)
*G03F 7/00* (2006.01)

(52) U.S. Cl.
CPC .......... *G03F 7/70325* (2013.01); *G03F 7/702* (2013.01)

(58) Field of Classification Search
CPC .... G03F 7/70325; G03F 7/702; G03F 7/7005; G03F 7/70291; G03F 7/2004; G03F 7/70116; G02B 26/0833

See application file for complete search history.

(56) References Cited

U.S. PATENT DOCUMENTS

| 2008/0158529 A1* | 7/2008 | Hansen | G03F 7/705 |
| | | | 355/53 |
| 2016/0103394 A1* | 4/2016 | Markle | G03F 7/7015 |
| | | | 355/71 |

FOREIGN PATENT DOCUMENTS

| KR | 10-2006-0102270 A | 9/2006 |
| KR | 10-2019-0100974 A | 8/2019 |

* cited by examiner

*Primary Examiner* — Mesfin T Asfaw
(74) *Attorney, Agent, or Firm* — Stein IP, LLC

(57) ABSTRACT

The present subject matter provides a high-speed nanopatterning method and apparatus of two-color super-resolution photolithography. According to the present subject matter, a high-speed nanopatterning apparatus of two-color super-resolution photolithography comprises: a first light source for outputting photochemical reaction initiation light of a first wavelength causing a photochemical reaction to occur in an illuminated area of a photoresist; a first lens for enlarging a beam size of the photochemical reaction initiation light; a second light source for outputting inhibition light of a second wavelength suppressing the photochemical reaction in the illuminated area of the photoresist; a second lens for enlarging a beam size of the inhibition light; and a digital micromirror device including a plurality of micromirrors controlled at a first angle and a second angle and for reflecting a portion of the photochemical reaction initiation light output from the first light source or the inhibition light output from the second light source toward the photoresist through the plurality of micromirrors.

8 Claims, 4 Drawing Sheets

HIGH-SPEED NANOPATTERNING METHOD AND APPARATUS OF TWO-COLOR SUPER-RESOLUTION PHOTOLITHOGRAPHY

CROSS-REFERENCE TO RELATED APPLICATION

This application claims under 35 U.S.C. § 119(a) the benefit of Korean Patent Application No. 10-2022-0101939 filed on Aug. 16, 2022, the entire contents of which are incorporated herein by reference.

BACKGROUND

(a) Technical Field

The present invention relates to a high-speed nanopatterning method and apparatus of two-color super-resolution photolithography.

(b) Background Art

In the semiconductor industry, a high-resolution technology of photolithography equipment is required for an ultra-fine circuit process.

Photolithography using visible light is easy to apply to mass production because nanopatterning is possible in a general environment without special conditions, and can perform large-scale three-dimensional (3D) nanopatterning in a non-invasive and non-contact manner, but has the disadvantage in that the resolution is limited by an optical diffraction limit.

As such, since the resolution of the photolithography equipment is limited by the optical diffraction limit, the use of a short-wavelength laser is required to realize high resolution.

With the recent development of short-wavelength lasers, visible light, deep ultraviolet (DUV), and extreme ultraviolet (EUV) are developing in that order.

In particular, EUV lithography is capable of super-resolution nanopatterning at a level of several nm. However, there are difficulties in developing photoreactive materials that respond to the EUV. In addition, 100,000 highly complex multi-reflection coated optical components make up a large and complex device that has a height of 5 m and a weight of 180 tons.

The inside of the equipment should be maintained in a high vacuum condition and the temperature should be controlled in units of 0.005° C. A price per piece of equipment that is very complex and requires ultra-precision is 150 billion won and has the disadvantage that it takes as long as five months to manufacture.

Another technology for increasing the resolution of photolithography is two-color visible light super-resolution photolithography. The super-resolution photolithography has been studied using two wavelengths of photochemical reaction initiation light (Photoinitiation) and inhibition light (Photoinhibition). However, the conventional two-color super-resolution photolithography technology has a limitation in that speed is slow because point scanning is performed for 3D nanopatterning.

SUMMARY OF THE DISCLOSURE

In order to solve the above problems of the related art, the present invention provides a high-speed nanopatterning method and apparatus of two-color super-resolution photolithography capable of improving a nanopatterning speed of two-color super-resolution photolithography.

In order to achieve the above object, according to an aspect of the present invention, a high-speed nanopatterning apparatus of two-color super-resolution photolithography includes: a first light source for outputting photochemical reaction initiation light of a first wavelength causing a photochemical reaction to occur in an illuminated area of a photoresist; a first lens for enlarging a beam size of the photochemical reaction initiation light; a second light source for outputting inhibition light of a second wavelength suppressing the photochemical reaction in the illuminated area of the photoresist; a second lens for enlarging a beam size of the inhibition light; and a digital micromirror device including a plurality of micromirrors controlled at a first angle and a second angle and for reflecting a portion of the photochemical reaction initiation light output from the first light source or the inhibition light output from the second light source toward the photoresist through the plurality of micromirrors.

A first pattern may be formed in the photoresist by the photochemical reaction initiation light, a second pattern may be formed in the photoresist by the inhibition light, and a final pattern, in which a size of an effective area where the photochemical reaction occurs is reduced by overlapping the first pattern and the second pattern, may be formed.

The effective area may be formed by partially overlapping the first pattern and the second pattern due to a light-spreading phenomenon caused by a diffraction of the photochemical reaction initiation light and the inhibition light.

The photochemical reaction initiation light and the inhibition light may have a Gaussian function form when focused by an objective lens.

The first angle may be 12° and the second angle may be −12°, the photochemical reaction initiation light may be reflected toward the photoresist through the first micromirrors having the 12°, and the inhibition light may be reflected to a beam dump through the first micromirrors having the 12°.

The inhibition light may be reflected toward the photoresist through second micromirrors having the −12°, and the photochemical reaction initiation light may be reflected to the beam dump through the second micromirrors having the −12°.

According to another aspect of the present invention, a high-speed nanopatterning method of two-color super-resolution photolithography includes: outputting, through a first light source, photochemical reaction initiation light of a first wavelength causing a photochemical reaction to occur in an illuminated area of a photoresist; enlarging a beam size of the photochemical reaction initiation light through a first lens; outputting, through a second light source, inhibition light of a second wavelength suppressing the photochemical reaction in the illuminated area of the photoresist; enlarging a beam size of the inhibition light through a second lens; and reflecting, through a digital micromirror device including a plurality of micromirrors controlled at a first angle and a second angle, a portion of the photochemical reaction initiation light output from the first light source or the inhibition light output from the second light source toward the photoresist.

According to the present invention, it has a resolution equal to that of EUV lithography, is cheaper to manufacture equipment compared to the EUV lithography, and is easy to operate, so mass production is possible.

In addition, according to the present invention, it is possible to form various two-dimensional (2D) patterns, which can be modulated by a computer program, at high speed without a mask, and implement high-speed nanopatterning through pattern illumination.

DETAILED DESCRIPTION

Figure 1:
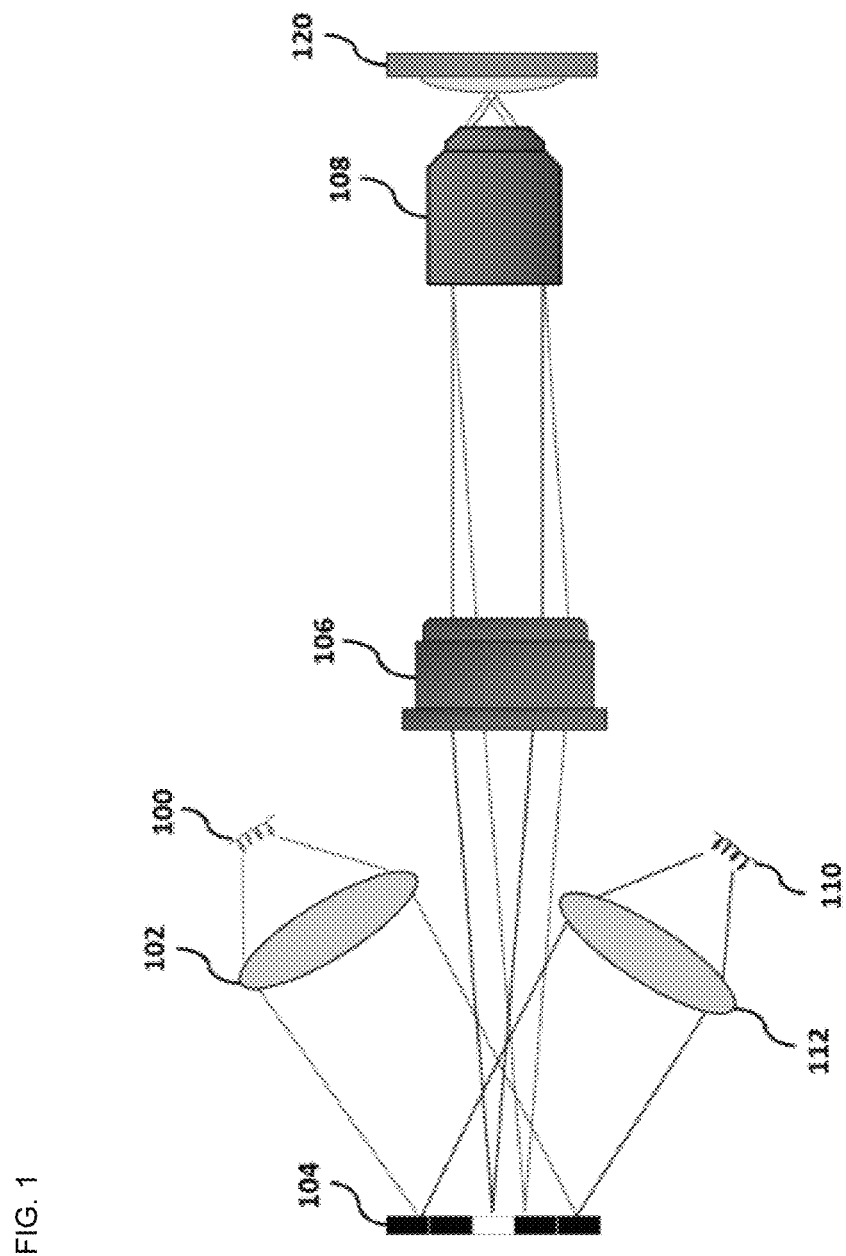
FIG. 1 is a diagram schematically illustrating a structure of a photolithography device using a DMD according to the present embodiment.

Since the present invention may be variously modified and have several embodiments, specific embodiments will be illustrated in the accompanying drawings and be described in detail in a detailed description. However, it is to be understood that the present invention is not limited to a specific embodiment, but includes all modifications, equivalents, and substitutions included within the spirit and technical scope of the present invention.

The terms used in the present specification are used only to describe specific embodiments, and are not intended to limit the present invention. Singular forms include plural forms unless the context clearly indicates otherwise. It should be understood that the terms "include" or "have" used in the present specification specify the presence of features, numerals, steps, operations, components, parts described in the present specification, or combinations thereof, but do not preclude the presence or addition of one or more other features, numerals, steps, operations, components, parts, or combinations thereof.

In addition, components of the embodiments described with reference to each drawing are not limitedly applied only to the corresponding embodiment, and may be implemented to be included in other embodiments within the scope of maintaining the technical spirit of the present invention. In addition, it goes without saying that these components may also be re-implemented as one embodiment in which a plurality of embodiments are integrated, even if a separate description is omitted.

In addition, in the description with reference to the accompanying drawings, regardless of reference numerals, the same components will be given the same or related reference numerals and duplicate descriptions thereof will be omitted. When it is decided that the detailed description of the known art related to the present invention may unnecessarily obscure the gist of the present invention, a detailed description thereon will be omitted.

The present embodiment provides a new photolithography technology for implementing ultra-fine nanostructure fabrication/circuit process/nanopatterning at high speed, and uses a digital micromirror device (hereinafter referred to as 'DMD') to improve the nanopatterning speed of two-color super-resolution photolithography.

In photolithography, in general, when the light of an appropriate wavelength (first wavelength) is illuminated on a photoresist containing a chemical substance that causes a photochemical reaction, a photochemical reaction such as a polymerization reaction occurs in the illuminated area and the remaining unilluminated portion is dissolved in a developing solvent to form nanostructures.

In the two-color super-resolution photolithography, the photolithography additionally contains a chemical substance that suppresses a photochemical reaction, and this chemical substance is expressed when illuminated with light of an appropriate wavelength (second wavelength), so the polymerization reaction does not occur.

Therefore, by surrounding a focus of the first wavelength with the light of a second wavelength, a size of an effective area where the photochemical reaction occurs is reduced.

Conventionally, by mainly modulating a phase in a pupil plane of an objective lens, the focal point of the second wavelength light is made into a donut shape to surround the focus of the first wavelength light.

Accordingly, point scanning is used to form one focus with an objective lens and create a two-dimensional (2D) nanostructure, which has the disadvantage of being slow.

Therefore, in this embodiment, high-speed nanopatterning of two-color super-resolution photolithography is implemented using the DMD.

FIG. 1 is a diagram schematically showing a structure of a photolithography device using a DMD according to the present embodiment.

As shown in FIG. 1, a device according to this embodiment may include a first light source 100, a first lens 102, a DMD 104, a tube lens 106, an objective lens 108, a second light source 110, and a second lens 112.

The first light source 100 may be an incoherent light source (LED) having diverging characteristics, and light output from the first light source 100 is a photochemical reaction initiation light having a first wavelength that causes a photochemical reaction in a photoresist 120 and light output from the second light source 110 is inhibition light having a second wavelength that suppresses a photochemical reaction in the photoresist 120.

A beam size of the photochemical reaction initiation light is enlarged by the first lens 102 and the photochemical reaction initiation light is irradiated to the entire area of the DMD 104 with uniform intensity.

The DMD 104 is composed of hundreds of thousands of micromirrors 130 that may be controlled in a binary manner.

A plurality of micromirrors 130 may be individually controlled to be inclined at an angle of +/−12°.

Among the numerous micromirrors 130 constituting the DMD 104, the photochemical reaction initiation light incident on the micromirror inclined at +12° is reflected in a direction perpendicular to the DMD 104, and is irradiated to the photoresist 120 by the tube lens 106 and the objective lens 108 to form a first pattern.

A beam size of inhibition light is enlarged by the second lens 112 and the inhibition light is irradiated to the entire area of the DMD 104 with uniform intensity.

The inhibition light is incident in the opposite direction to the initiation light, and the inhibition light incident on the micromirror 130-1 inclined at −12° is reflected in the direction perpendicular to the DMD 104, and is irradiated to the photoresist 120 by the tube lens 106 and the objective lens 108 to form a second pattern.

Here, the first pattern and the second pattern overlap each other, thereby determining an effective area where the photochemical reaction occurs.

Figure 2:
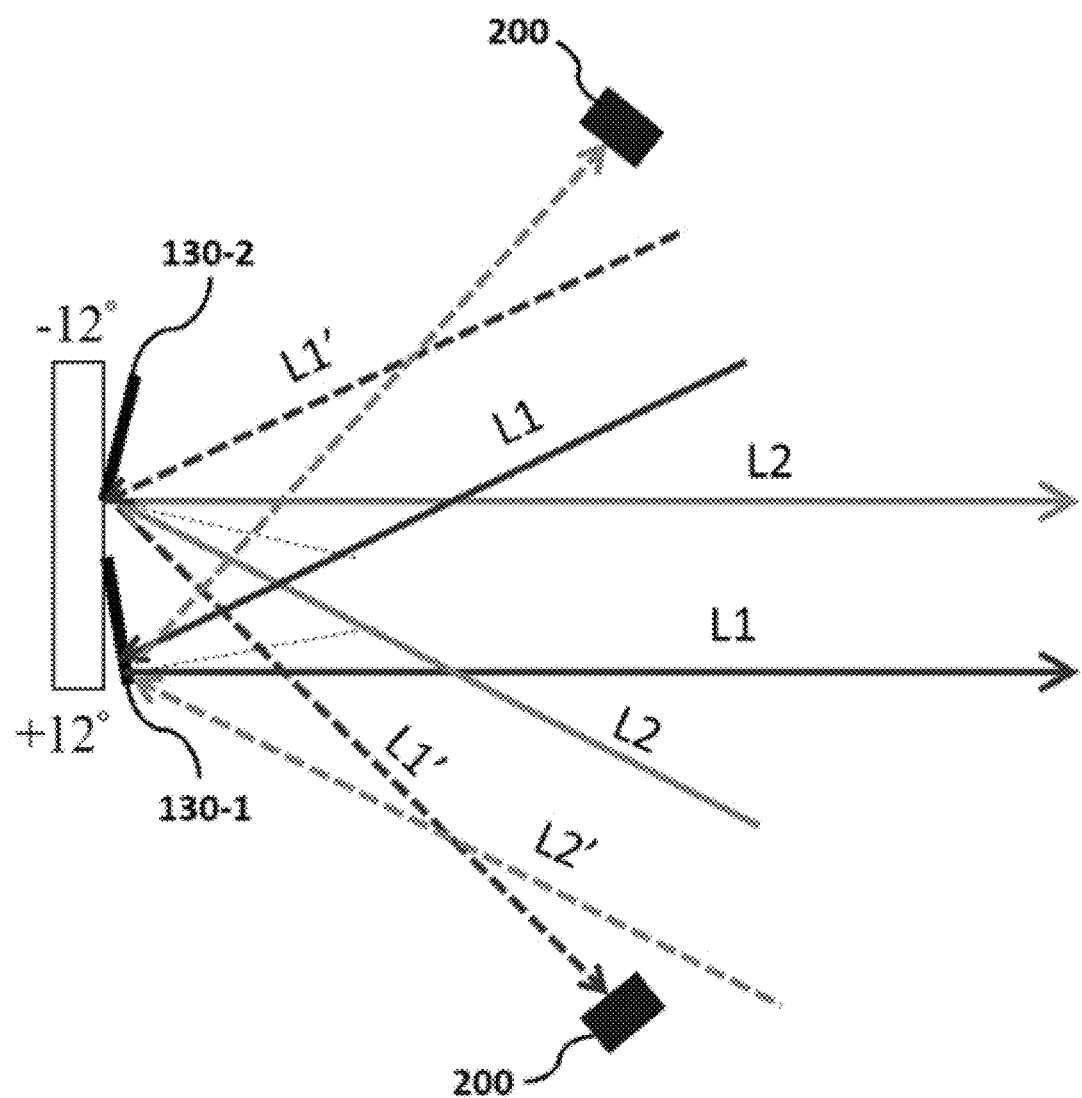
FIG. 2 is a diagram illustrating an optical path, in which photochemical reaction initiation light and inhibition light are separated and travel by a micromirror constituting the DMD according to the present embodiment.

FIG. 2 is a diagram illustrating an optical path, in which the photochemical reaction initiation light and the inhibition light are separated and travel by a micromirror constituting the DMD according to the present embodiment.

Referring to FIG. 2, among the lights departing from the first light source 100, light L1 reflected by the first micromirror 130-1 inclined at an angle of +12° travels in the direction perpendicular to the DMD 104 and propagates to the tube lens 106.

Among the lights departing from the first light source 100, light L1' reflected by a second micromirror 130-2 inclined at an angle of −12° is reflected in a direction 14 leaving the optical system and is not used by being blocked with a beam dump 200.

Among the lights departing from the second light source 110, light L2 reflected by the second micromirror 130-2 inclined at an angle of −12° travels in the direction perpendicular to the DMD 106 and propagates to the tube lens 106.

Among the lights departing from the second light source 110, light L2' reflected by a first micromirror 130-1 inclined at an angle of +12° is reflected in the direction leaving the optical system and is not used by being blocked with the beam dump 200.

According to this embodiment, in the two-color super-resolution photolithography, some of the photochemical reaction initiation light output from the first light source 100 or the inhibition light output from the second light source 110 using micromirrors 130 having different angles may be reflected toward the photoresist 120, and thus, a two-dimensional black and white pattern to illuminate the photoresist 120 may be formed.

An inverted two-dimensional black and white pattern may be formed by reversing the incident angles of the initiation light and inhibition light, and since polymerization does not occur in the area where the two patterns overlap due to diffraction, finer nanostructures may be made compared to nanostructures produced with a single wavelength.

In addition, it is possible to manufacture 2D nanostructures with 2D pattern illumination without additional scanning.

Figure 3:
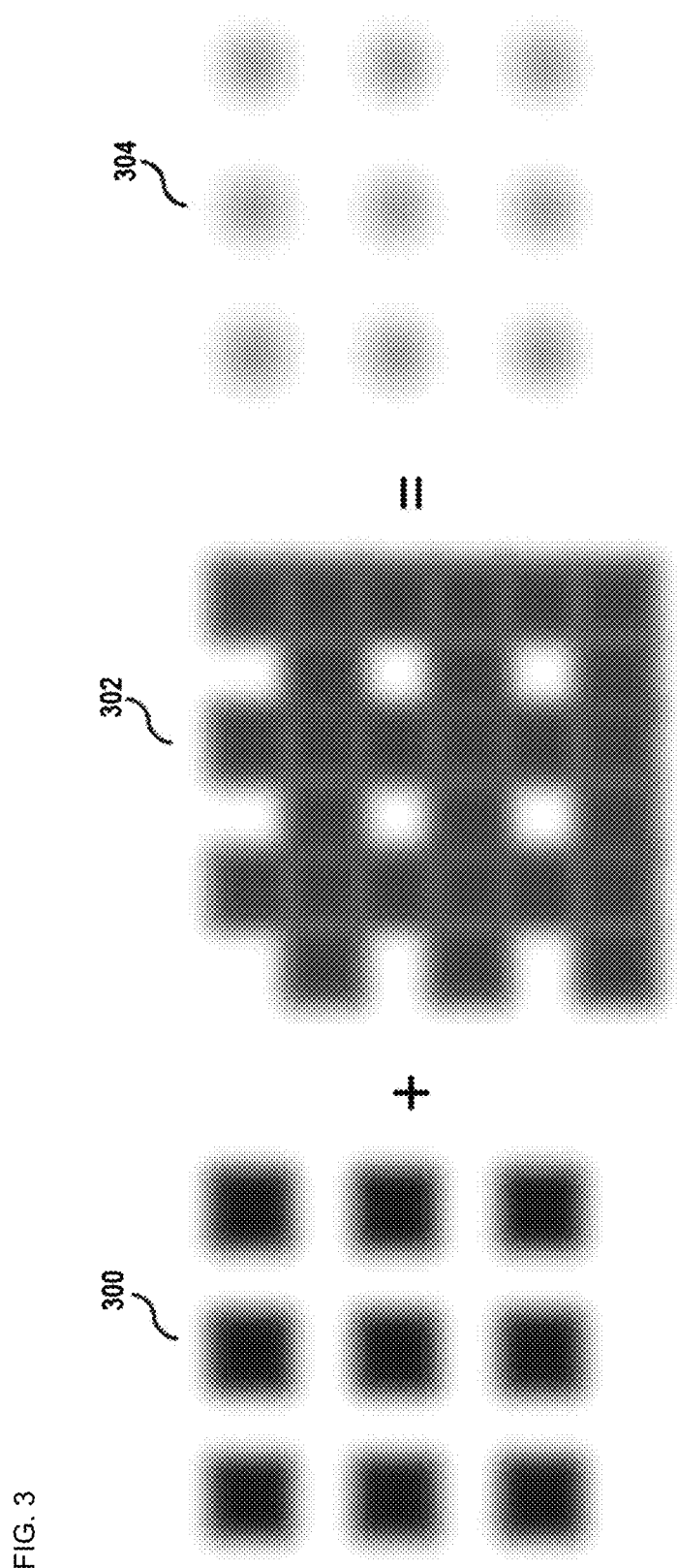
FIG. 3 is a diagram illustrating a principle of pattern illumination for super-resolution nanopatterning using two-color light and DMB.

FIG. 3 is a diagram illustrating a principle of pattern illumination for super-resolution nanopatterning using two-color light and DMB.

Referring to FIG. 3, a two-dimensional first pattern 300 is formed in the photoresist 120 through the initiation light reflected by the micromirror 130-1 inclined at +12°.

In addition, the inhibition light reflected to the micromirror 130-2 inclined at −12° forms a 2D second pattern 302 that is inverted from the first pattern.

The first and second patterns partially overlap by a light spreading phenomenon due to diffraction, and as a result, a final pattern 304 with a reduced size of an effective area where the photochemical reaction occurs may be formed.

Figure 4:
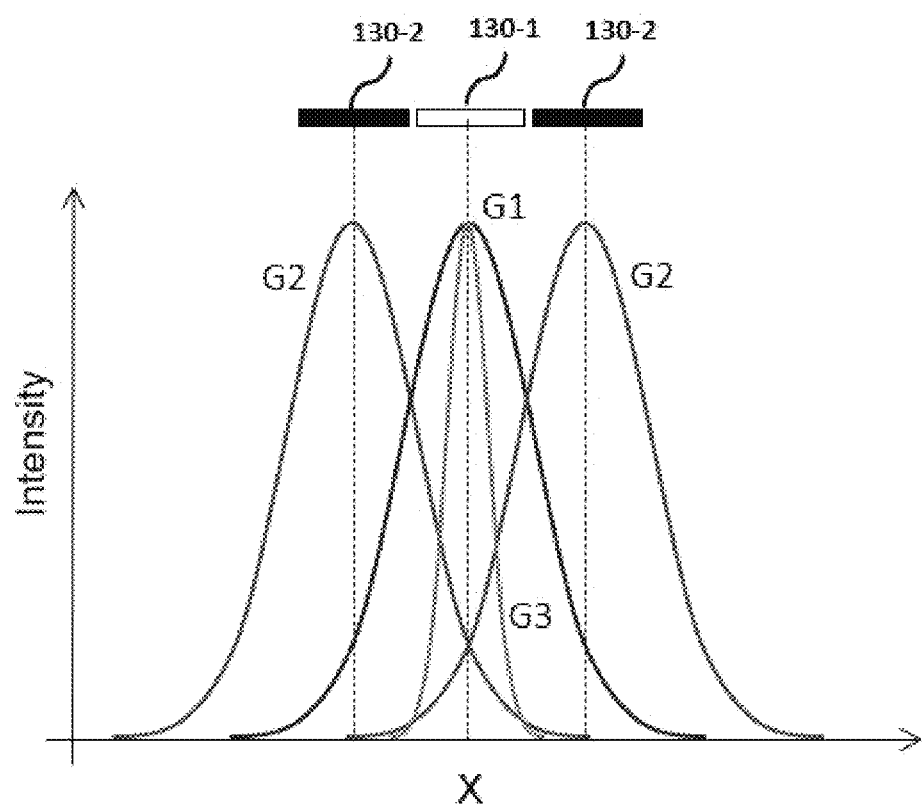
FIG. 4 is a diagram illustrating a principle of increasing the resolution of nanopatterning using two-color light and DMD.

FIG. 4 is a diagram illustrating a principle of increasing the resolution of nanopatterning using two-color light and DMD.

When the initiation light reflected on the first micromirror 130-1 inclined at +12° is focused on the photoresist 120 by the objective lens 108, it spreads in the form of a Gaussian function G1 by diffraction.

When the inhibition light reflected on the micromirror 130-2 inclined at −12° surrounding the first micromirror 130-1 is also focused on the photoresist 120 by the objective lens 108, two lights overlap each other since they spread in the form of a Gaussian function G2 by diffraction.

Since the chemical reaction is determined according to the intensity ratio of the light that causes the photochemical reaction and the light that suppresses the photochemical reaction, the photochemical reaction is suppressed in a partially overlapping area. Therefore, since the chemical reaction occurs only in an area (area by G3) smaller than the focal area spread by diffraction, finer nanopatterning is possible.

The embodiments of the present invention described above have been disclosed for illustrative purposes, and those skilled in the art with ordinary knowledge of the present invention will be able to make various modifications, changes, and additions within the spirit and scope of the present invention, and these modifications, changes, and additions should be regarded as falling within the scope of the following claims.

What is claimed is:

1. A high-speed nanopatterning apparatus of two-color super-resolution photolithography, comprising:
    a first light source for outputting photochemical reaction initiation light of a first wavelength causing a photochemical reaction to occur in an illuminated area of a photoresist;
    a first lens for enlarging a beam size of the photochemical reaction initiation light;
    a second light source for outputting inhibition light of a second wavelength suppressing the photochemical reaction in the illuminated area of the photoresist;
    a second lens for enlarging a beam size of the inhibition light; and
    a digital micromirror device including a plurality of micromirrors controlled at a first angle and a second angle and for reflecting a portion of the photochemical reaction initiation light output from the first light source or the inhibition light output from the second light source toward the photoresist through the plurality of micromirrors,
    wherein a first pattern is formed in the photoresist by the photochemical reaction initiation light, a second pattern is formed in the photoresist by the inhibition light, and a final pattern in which a size of an effective area where the photochemical reaction occurs is reduced by overlapping the first pattern and the second pattern is formed.

2. The high-speed nanopatterning apparatus of claim 1, wherein the effective area is formed by partially overlapping the first pattern with the second pattern due to a light spreading phenomenon caused by a diffraction of the photochemical reaction initiation light and the inhibition light.

3. The high-speed nanopatterning apparatus of claim 2, wherein the photochemical reaction initiation light and the inhibition light have a Gaussian function form when focused by an objective lens.

4. The high-speed nanopatterning apparatus of claim 1, wherein the first angle is 12° and the second angle is −12°,
    the photochemical reaction initiation light is reflected toward the photoresist through first micromirrors having the 12°, and
    the inhibition light is reflected to a beam dump through the first micromirrors having the 12°.

5. The high-speed nanopatterning apparatus of claim 4, wherein the inhibition light is reflected toward the photoresist through second micromirrors having the −12°, and
    the photochemical reaction initiation light is reflected to the beam dump through the second micromirrors having the −12°.

6. A high-speed nanopatterning method of two-color super-resolution photolithography, comprising:

outputting, through a first light source, photochemical reaction initiation light of a first wavelength causing a photochemical reaction to occur in an illuminated area of a photoresist;

enlarging a beam size of the photochemical reaction initiation light through a first lens;

outputting, through a second light source, inhibition light of a second wavelength suppressing the photochemical reaction in the illuminated area of the photoresist;

enlarging a beam size of the inhibition light through a second lens; and reflecting, through a digital micromirror device including a plurality of micromirrors controlled at a first angle and a second angle, a portion of the photochemical reaction initiation light output from the first light source or the inhibition light output from the second light source toward the photoresist, wherein a first pattern is formed in the photoresist by the photochemical reaction initiation light, a second pattern is formed in the photoresist by the inhibition light, and a final pattern in which a size of an effective area where the photochemical reaction occurs is reduced by overlapping the first pattern and the second pattern is formed.

7. The high-speed nanopatterning method of claim 6, wherein the effective area is formed by partially overlapping the first pattern with the second pattern due to a light spreading phenomenon caused by a diffraction of the photochemical reaction initiation light and the inhibition light.

8. The high-speed nanopatterning method of claim 7, wherein the photochemical reaction initiation light and the inhibition light have a Gaussian function form when focused by an objective lens.

* * * * *